(12) United States Patent
Behrends et al.

(10) Patent No.: US 9,535,104 B2
(45) Date of Patent: Jan. 3, 2017

(54) METHOD AND SYSTEM FOR DETECTING AN ARC FAULT IN A POWER CIRCUIT USING FREQUENCY RESPONSE

(71) Applicant: SMA Solar Technology AG, Niestetal (DE)

(72) Inventors: Holger Behrends, Kassel (DE); Marcel Kratochvil, Kassel (DE); Markus Hopf, Espenau (DE); Sebastian Bieniek, Niestetal (DE)

(73) Assignee: SMA Solar Technology AG, Niestetal (DE)

( * ) Notice: Subject to any disclaimer, the term of this patent is extended or adjusted under 35 U.S.C. 154(b) by 549 days.

(21) Appl. No.: 14/074,235

(22) Filed: Nov. 7, 2013

(65) Prior Publication Data

US 2014/0062500 A1    Mar. 6, 2014

Related U.S. Application Data

(63) Continuation of application No. PCT/EP2011/058290, filed on May 20, 2011.

(51) Int. Cl.
*G01R 31/02* (2006.01)
*H02H 1/00* (2006.01)
*H02S 50/10* (2014.01)

(52) U.S. Cl.
CPC ............. *G01R 31/02* (2013.01); *G01R 31/024* (2013.01); *H02H 1/0015* (2013.01); *H02S 50/10* (2014.12); *H02H 1/003* (2013.01)

(58) Field of Classification Search
CPC ....... G01R 31/02; G01R 31/024; H02S 50/10; H02H 1/0015; H02H 1/003

USPC .......................................................... 324/537
See application file for complete search history.

(56) References Cited

U.S. PATENT DOCUMENTS

2007/0164750 A1* 7/2007 Chen .................... G01R 31/025
                                                            324/527
2008/0106250 A1   5/2008 Prior et al.

FOREIGN PATENT DOCUMENTS

WO        0210782 A2   2/2002
WO     2011032993 A1   3/2011

OTHER PUBLICATIONS

International Search Report & Written Opinion of the International Searching Authority dated Mar. 2, 2012 for International Application No. PCT/EP2011/058290. 12 Pages.

* cited by examiner

*Primary Examiner* — Billy Lactaoen
(74) *Attorney, Agent, or Firm* — Eschweiler & Associates, LLC

(57) ABSTRACT

A method of detecting an arc fault in a power circuit includes injecting an AC-signal into the power circuit and measuring a response signal that is related to the injected AC-signal in the power circuit. The method further includes determining a frequency response of the power circuit from the response signal, analyzing the frequency response, and identifying a preferred frequency. A signal related to AC-current flowing in the power circuit within the preferred frequency range is measured and an occurrence of an arc fault in the power circuit is signaled depending on the measured signal. A system for detecting an arc fault is designed to perform a method as described before.

19 Claims, 3 Drawing Sheets

METHOD AND SYSTEM FOR DETECTING AN ARC FAULT IN A POWER CIRCUIT USING FREQUENCY RESPONSE

REFERENCE TO RELATED APPLICATION

This application is a continuation of International Application number PCT/EP2011/058290 filed on May 20, 2011.

FIELD

The disclosure relates to a method for detecting an arc fault in a power circuit, in particular within a photovoltaic system. The disclosure further relates to an arc fault detection system and a photovoltaic system comprising a corresponding detection system.

BACKGROUND

A power circuit, in particular DC (Direct Current)-power circuits that work with high voltages and high currents, for example in photovoltaic systems or systems providing off-grid power supply, are prone to the development of electric arcs. Electric arcs can for example occur when a power line with a high current load is interrupted during maintenance or in case contacts at interconnectors are degraded. Other possible courses for arc faults, i.e. the occurrence of an electric arc in the power circuit, are corroded solder joints or broken insulators of the power lines. Arc faults are the most common fire causes in photovoltaic systems. This also reflects in the requirements for arc fault protection for photovoltaic systems as for example regulated by the National Electric Code (NEC) 690.11 of the United States of America coming into force in 2011.

A reliable arc fault detection method and system is therefore of major importance. On the one hand, for security reasons the existence of an arc fault has to be detected with a reliability as high as possible. On the other hand, the probability of an erroneous indication of a supposed arc fault has to be as low as possible, in particular if an erroneous detection of an arc fault might lead to a shutdown of a photovoltaic system without the option to automatically restart it, as for example specified in the before mentioned NEC 690.11 code.

Electric arcs usually emit a broadband AC (Alternating Current)-signal in an RF (Radio Frequency)-frequency range. Detection systems for arc faults that are based on detecting an according radio frequency signal in the power circuit are well established and for example known from document WO 95/25374. A problem associated with the detection of arc faults via their AC-current signature can arise from the weakness of the signal. In order to ensure that arc faults are assuredly detected, detection circuits with a high detection sensitivity are required. A down-side of high detection sensitivity could be an increased number of nuisance alarm situations, in which a noise signal, e.g. due to a disturbing RF-signal that is coupled into the detection circuit, is misinterpreted and wrongly assigned to the presence of an arc fault. Possible sources of disturbing signals are for example RF-radio transmitter, electric trains or trams passing by, electric or electronic devices with an insufficient electro-magnetic shielding or interference suppression, or arcs in adjacent power systems. In the following, all possible RF-sources other than an arc fault in the respective power system are hereinafter referred to as a "disturber".

It is thus desirable to create a method and system for reliably detecting arc faults in a power circuit. It is further- more desirable to describe a photovoltaic system with a corresponding detection system.

SUMMARY

According to a first aspect of the disclosure, a method of detecting an arc fault in a power circuit comprises injecting an AC-signal into the power circuit and measuring a response signal that is related to the injected AC-signal in the power circuit. The method further comprises determining a frequency response of the power circuit from the response signal, analyzing the frequency response, and identifying a preferred frequency range based on the analyzed frequency response. The method still further comprises measuring a signal related to AC-current flowing in the power circuit within the preferred frequency range, and signaling an occurrence of an arc fault in the power circuit based on the measured signal.

By first determining the frequency response of the power circuit and subsequently determining a preferred frequency range for detecting AC-signals, it is ensured that the detection is well suited for the power circuit. Arc faults can be identified with a high reliability since it is ensured that AC-signals are e.g. not suppressed in the observed frequency range due to an unsuited frequency response of the power circuit. Arc faults are detected more reliably and nuisance alarm situations can accordingly be prevented.

In one embodiment of the method, the acts performed to determine the frequency response and the preferred frequency range (initialization phase) are performed nonrecurring at a beginning of a predetermined working period of the power circuit, while the following acts (observation phase) are performed repeatedly during this working period. This ensures that the observation phase is being optimized for every working period, e.g. every time a power system starts its operation.

In another embodiment of the method, the injected AC-signal comprises signals at various frequencies. In one embodiment, the AC-signal is a noise signal and in particular a white noise signal. In yet another embodiment, a frequency of the injected AC-signal is varied. These embodiments allow for an easy determination of the frequency response of the power circuit.

In a further embodiment of the method, the preferred frequency range is chosen such that it does not comprise a distinct maximum of an impedance curve derived from the frequency response. The impedance curve describes how the impedance of the power circuit depends on the frequency. Particularly, in one embodiment the preferred frequency range is chosen to be located around a minimum of the impedance curve. Both ways, a well suited frequency range for observing arcs is identified. It is prevented that AC-signals within the preferred frequency range are dampened, thereby perturbing a secure detection of an arc fault.

In another embodiment of the method, the occurrence of an arc fault is signaled if a value related to the amplitude of the signal within the preferred frequency range exceeds a predetermined threshold. In one embodiment, the occurrence of an arc fault is signaled if a value related to the time derivative of the amplitude of the signal within the preferred frequency range exceeds a further predetermined threshold. Further, in one embodiment the occurrence of an arc fault is signaled only if the predetermined threshold and the further predetermined threshold are exceeded. In some embodiments, the value related to the amplitude or its time derivative is a floating average of the amplitude of the signal or its time derivative, respectively, or is a combination of two floating averages of the amplitude or its time derivative with different integration windows. In all these embodiments the reliability of the arc detection is further increased.

In a further embodiment of the method, the predetermined threshold and/or the further predetermined threshold are determined depending on the impedance curve derived from the frequency response. By adapting the thresholds to the determined impedance curve (i.e. the frequency dependence of the impedance), an optimized sensitivity for the detection of an arc fault is provided, which is high enough to ensure that all arc faults are reliably detected and, on the other hand, is not too high for the detection system to be exaggeratedly susceptible to interferences of disturbers.

According to a second aspect of the disclosure, an arc fault detection system comprises an incoupling circuit configured to inject an AC-signal into the power circuit, an outcoupling circuit configured to measure a signal related to AC-current flowing in the power circuit, and a control unit operably connected to the incoupling circuit and the outcoupling circuit. The arc fault detection system is designed to perform a method according to the first aspect. The same advantages as described in connection with the first aspect arise.

According to a third aspect of the disclosure, a power system, in particular a photovoltaic power system, comprises an arc fault detection system according to the second aspect of the disclosure. The same advantages as described in connection with the first and the second aspect arise.

BRIEF DESCRIPTION OF THE DRAWINGS

The disclosure is now described in more detail and will be fully understood with reference to the following detailed description in conjunction with the drawings. The drawings show.

DETAILED DESCRIPTION

Figure 1:
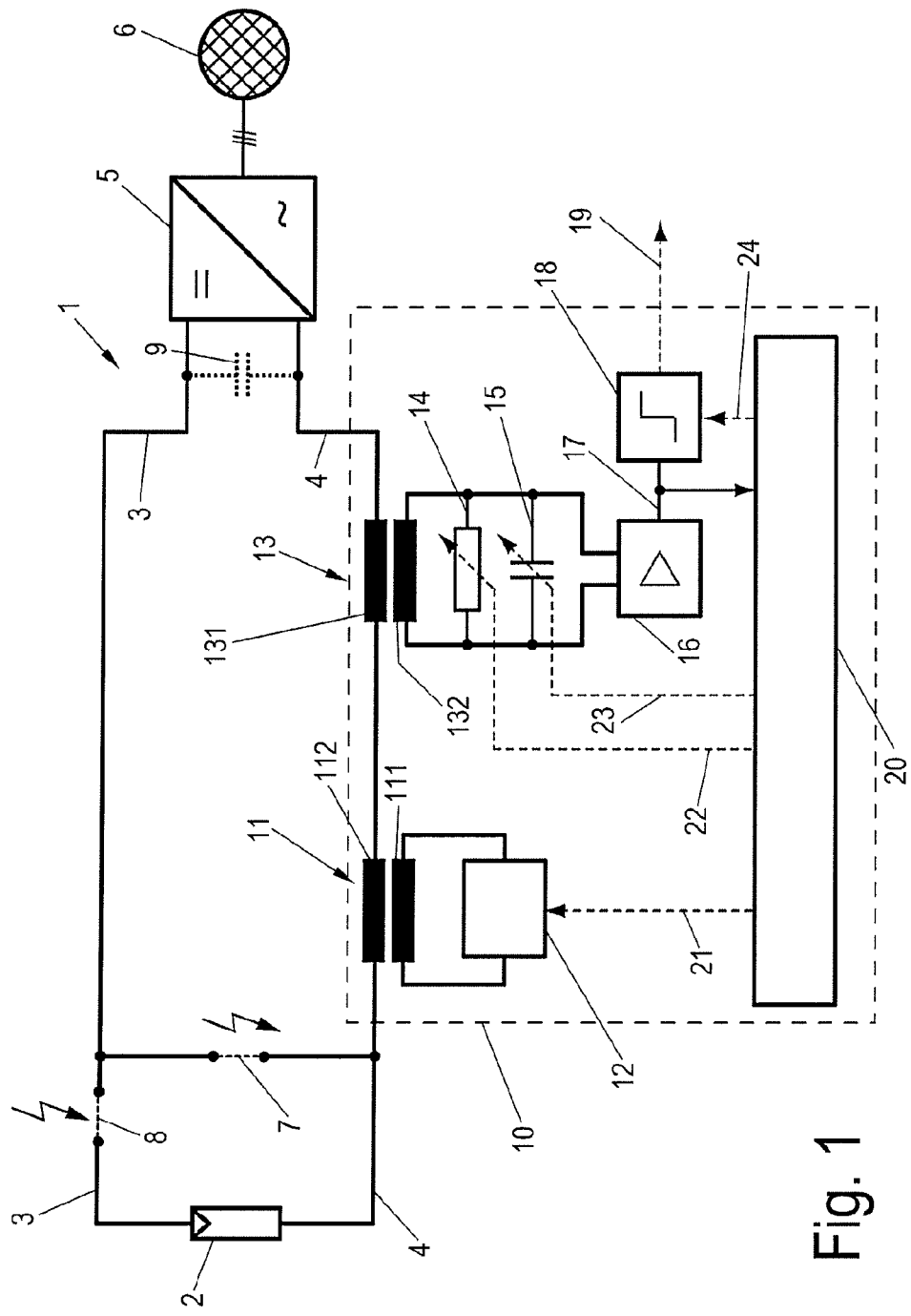
FIG. 1 a schematic wiring diagram of a photovoltaic system with an arc fault detection system.

FIG. 1 shows a photovoltaic system 1, in the following abbreviated as PV-system 1, in a schematic wiring diagram as an example of a DC (Direct Current)-power circuit. The PV-system 1 comprises a photovoltaic generator 2 (PV-generator 2) that is connected to an inverter 5, e.g. a DC/AC (Direct Current/Alternating Current)-converter, by way of DC-power lines 3,4. The inverter 5 is connected to a power grid 6 on its AC-side.

The power grid 6 can either be a private or a public power grid. By way of example the power grid 6 is a 3-phase system and the inverter 5 is designed to feed in all 3-phases. However, the disclosure can be realized with a power grid and/or inverter operating with any number of phases, for example one or two phases.

Also by way of example, the PV-generator 2 is symbolized by the circuit symbol of a single photovoltaic cell. In a realization of the shown PV-system 1, the PV-generator 2 can for example be a single photovoltaic module (PV-module) that itself comprises a plurality of photovoltaic cells. In another embodiment, the PV-generator 2 can comprise a plurality of PV-modules that, for example, are connected in series and form a so-called string. Furthermore, a parallel connection or a combined serial/parallel connection of PV-modules is possible.

Two different kinds of arc faults that can occur in the power circuit formed by the PV-generator 2, the power lines 3, 4 and the input state of the inverter 5 are depicted in FIG. 1. The first kind is a parallel arc 7 burning in parallel to the PV-generator 2 as the power source of the power circuit. The second kind is a series arc 8 that is electrically in series with the PV-generator 2 and located at an interruption within one of the power lines 3, 4. The two different kinds of arc 7, 8 are symbolized in FIG. 1. By way of example, the series arc 8 is located in power line 3. Also by way of example, the parallel arc 7 is located in parallel with the PV-generator 2. Generally, parallel arcs can develop between two points with different potentials. A parallel arc can thus also develop in parallel with a part of the PV-generator 2, e.g. be located in parallel with a single PV-module.

Furthermore, as a special case of a parallel arc, an electric arc can also develop against ground potential, for example in a situation, in which the power lines 3, 4 are installed in grounded metal pipes. An arc against ground potential is referred to as a ground arc in the following. A ground arc can for example develop between one of the power lines 3, 4 and ground potential, if the other power line 4, 3 is intentionally or unintentionally grounded.

The PV-system 1 of FIG. 1 is equipped with an arc fault detection system 10.

The arc fault detection system 10 comprises an incoupling circuit 11 for injecting an AC-signal into the DC-power circuit of the PV-system 1. In the example shown, the incoupling circuit 11 is a transformer with a primary side 111 and a secondary side 112. The primary side 111 is connected to a controllable signal generator 12. The secondary side 112 has a low DC-resistance and is looped into the DC-power circuit.

The detection system 10 further comprises an outcoupling circuit 13, by way for example again realized by a transformer with a primary side 131 and a secondary side 132. In this case, the primary side 131 shows a low DC-resistance and is looped into the power circuit. The purpose of the outcoupling circuit 13 is to couple AC-signals out of the power circuit to enable analyzing AC-signals present in the DC-power circuit. In the embodiment of FIG. 1, the secondary side 132 of the outcoupling circuit 13 is part of an oscillator circuit, which further comprises a variable resistor 14 and a variable capacitor 15.

In the example shown, the incoupling circuit 11 as well as the outcoupling circuit 13 are located (i.e. looped into) the power line 4. This arrangement is by no means limiting. It would as well be possible to loop the incoupling circuit 11 and the outcoupling circuit 13 both into the other power line 3 or one into the power line 3 and the other into the power line 4. Also, there is no restriction whether the incoupling circuit 11 and/or the outcoupling circuit 13 are located close to the PV-generator 2 or the inverter 5. In this respect, it is a particular option to integrate the detection system 10 including the incoupling circuit 11 and the outcoupling circuit 13 into the inverter 5 of the PV-system 1.

The oscillator circuit that comprises the secondary side 132 of the outcoupling circuit 13 is connected to a filter and amplifier unit 16 with a signal output 17 that is guided to a threshold detector 18. The filter and amplifier unit 16 conditions the AC-signal picked up by the secondary side 132, e.g by a bandpass-filter and an amplifier, and converts it to a DC-signal representative of the amplitude of the AC-signal, e.g. by an envelope decoder. The threshold detector 18 compares the output of the filter and amplifier unit 16 and provides an arc-signalling line 19, which is activated if the signal output 17 of the filter and amplifier unit 16 exceeds a pre-determined threshold value.

It is noted that the incoupling circuit 11 and the outcoupling circuit 13 are not necessarily transformers as shown in FIG. 1. All-known means that can be used to either inject an AC-signal into a high current DC-circuit and/or to pick up an AC-signal component present in a DC-circuit can be utilized. In particular, the secondary side 132 of the outcoupling circuit 13 can be realized as a pickup-coil which is assigned to the respective DC-power line 3,4. The pickup-coil can for example be designed as a Rogowski-coil. The primary side 131 of the outcoupling means 13 could be a cable of the DC-power line 3,4 or a printed circuit board track within the inverter 5. In further embodiments, other known-types of outcoupling circuit 13 can be used, for example Hall sensors or shunts with a low ohmic resistance.

The detection system 10 further comprises a control unit 20 with control outputs 21-24. The control unit 20 controls parameters and settings of selected ones of the afore-mentioned components of the detection system 10. Control line 21 is connected to the signal generator 12 and allows the control unit 20 to activate/deactivate the signal generator 12 and/or control its frequency and/or amplitude. Control lines 22 and 23 are used to vary parameters of the oscillator circuit, by way of example to control the resistance of the resistor 14 and the capacitance the capacitor 15. Varying the capacitance changes the resonance frequency of the oscillating circuit and varying the resistance changes the quality (Q-factor) of the oscillator circuit and also influences its resonance frequency. Control line 24 provides a reference voltage that determines the height of the threshold of the threshold detector 18. Further control lines that are not shown could be present and used to for example control parameters of the signal and amplifier unit 16, e.g. its gain. It is noted that the control options, in particular the control options through the control lines 22-24, are exemplary and not limiting. The purpose of these control lines is to be able to influence the frequency characteristic of the arc fault detection, in particular to define a frequency range (e.g. position, width) which is checked for the presence of AC-signals indicating arc-faults.

In an alternative embodiment, the AC-signal provided by the secondary side 132 of the outcoupling circuit 13 could also be measured and analyzed without having a tuneable oscillator circuit, i.e. without the variable resistor 14 and/or the variable capacitor 15. In that case, the filter and amplifier unit 16 could for example comprise a tuneable bandpass-filter with a subsequent envelope decoder. Alternatively, the filter and amplifier unit 16 could be designed to condition and amplify the signal, but not rectify it. The control unit 20 would then sample and digitalize the output signal 17 and process it further digitally. In that case, the functionality of the threshold detector 18 would also operate digitally and would, in one embodiment, be part of the control unit 20.

In case an input-stage of the inverter 5 has a high impedance for AC-signals, a capacitor 9, depicted by a dashed-line in FIG. 1, might be connected in parallel to the input of the inverter 5. This capacitor allows an AC-current to flow in the power circuit. Often, a suitable capacitor is already present in the input-stage of an inverter, e.g. as part of an EMC (electromagnetic compatibility)-filter.

Figure 2:
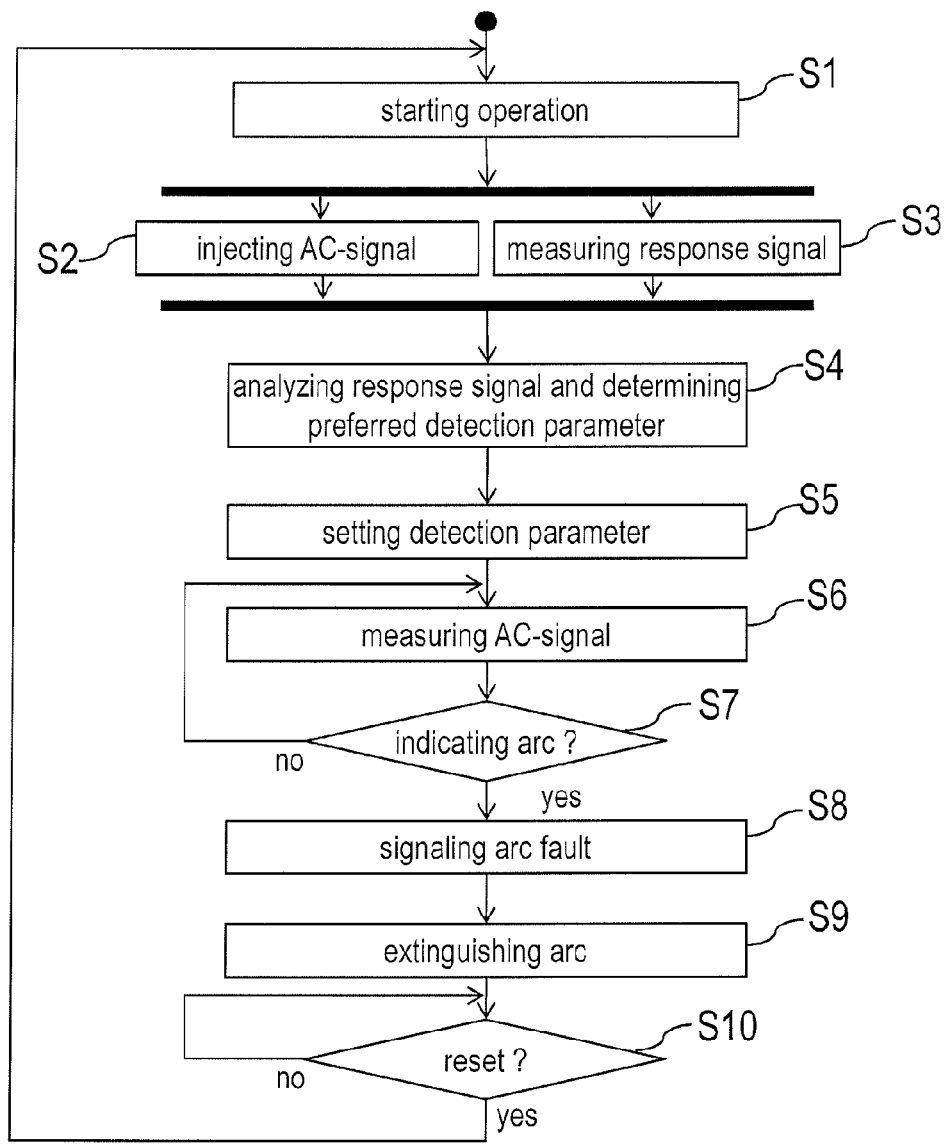
FIG. 2 a flow chart of an embodiment of a method for detecting the presence of an electric arc in a power circuit.

The functionality of the arc fault detection system 10 and its components will be described in detail in the following:

FIG. 2 shows a flow chart of a method for detecting electric arcs in a power circuit. The method can for example be performed by a detection system 10 as shown in FIG. 1. Without any limitation, it will therefore by way of example be described with reference to FIG. 1. The method is particularly suited for the detection of series arc 8, but not restricted to this kind of arcs.

In a first act, the power circuit, for example the PV-system 1 shown in FIG. 1 starts its operation. In case of the PV-system 1 of FIG. 1, this for example regularly occurs in the morning, when the intensity of the sunlight increases and the electric power produced by the PV-generator 2 is sufficient to start operation of the inverter 5. As mentioned before, in one embodiment the detection system 10 could be integrated into the inverter 5. The functionality of the control unit 20 could then be provided by a central control unit of the inverter 5. Alternatively, a separate control unit 20 could be used which is triggered to perform the following acts by the control unit of the inverter 5 after the inverter 5 has started its operation and performs its internal set up procedures.

In a second act S2, an AC-signal is generated by the signal generator 12 and injected into the DC-power circuit via the incoupling circuit 11. In the example of FIG. 1, the signal generator 12 e.g. generates a white-noise signal with a continuous frequency spectrum. Alternatively, a sine-signal of variable frequency with a single frequency component could be generated. The signal generator 12 would then be controlled via the control line 21 to perform a frequency sweep from a starting frequency up to a final frequency. The frequency range of the sweep could for example start at a few tens of kilohertz (kHz) and end at several hundreds of kilohertz.

In an act S3 that is performed in parallel to act S2, a response signal within the power circuit that is related to the injected AC-signal is measured via the outcoupling circuit 13, the oscillating circuit comprising the secondary side 132, the filter and the amplifier unit 16. The amplitude of the response signal is measured dependent on its frequency by tuning the oscillating circuit via the control lines 23 and/or 22 while the white noise AC-signal is injected into the DC-power circuit. In a case where an AC-signal with a single component of a varying frequency (frequency sweep) is injected into the power circuit at S2, the resonance frequency of the oscillating circuit is varied in parallel with the injected AC-signal and/or the resonance circuit is set to have a weak frequency dependence by an according setting of the variable resistor 14 and/or capacitor. As also mentioned earlier, the secondary side 132 of the outcoupling circuit 13 could be connected to the filter and amplifier unit 16 directly (i.e. without the variable resistor 14 and/or the variable capacitor 15) and the AC-signal could be sampled and digitalized. The frequency response could then for example be determined by a discrete FFT (Fast Fourier Transform) -method.

Figure 3:
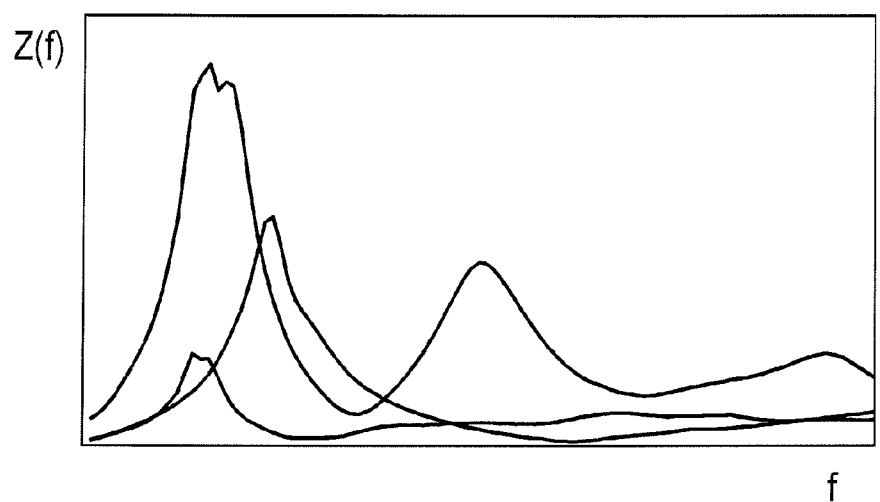
FIG. 3 illustrates example impedance curves of three different photovoltaic generators.

FIG. 3 shows three examples of a frequency response of three different PV-systems in an impedance-plot. The x-axis of the graph shows the frequency f on a linear scale. The frequency response is depicted on the y-axis as the impedance $Z(f)$ of the system, which is proportional to the inverse of the measured frequency dependent signal amplitude.

AC-signals in the DC-power circuit are strongly dampened at frequencies f where the DC-power circuit has a high impedance $Z(f)$. The frequency response of the DC-power circuit also governs the signal strength of an AC-signal that originates from an arc fault in the DC-power circuit. The knowledge of the frequency response of the system as measured in act S3 is in the following acts used to optimize the arc fault detection procedure.

In a next act S4, the frequency response is analyzed and a preferred frequency range for the arc fault detection is identified. A preferred frequency range is for example a frequency range where the impedance curve is at low values and preferably flat. The signal measuring part of the detection system 10 is then tuned to the identified preferred frequency range, e.g. by setting the variable resistor 14 and/or the variable capacitor 15 to suitable values.

In a next act S5, a threshold is determined that is adapted to the measured frequency response in the identified preferred frequency range. In the example of FIG. 1, the threshold detector 18 is provided with the determined threshold via the control line 24. In addition or alternatively, a gain of the filter and amplifier unit 16 could be modified depending on the frequency response in the preferred frequency range. The threshold and/or the gain are set to a value such that, on the one hand, the sensitivity of the arc fault detection system is high enough to ensure that all arc faults are reliably detected and, on the other hand, is not too high for the detection system 10 to be exaggeratedly susceptible to interferences of disturbers.

Acts S2 to S5 performed so far can be regarded as an initialization phase for optimizing the detection of electric arcs. The following acts now concern the actual observation and eventual detection of an arc (observation phase). It is desireable in one embodiment to perform the acts of the initialization phase only once at the beginning of a longer observation phase (working period). In case of a PV-system as the DC-power circuit, the acts of the initialization phase could be performed every time the inverter starts operation, e.g. at least once every morning. Alternatively or additionally, the initialization phase could be repeated in regular time intervals, e.g. every few hours. A further option is to go through the initialization phase after a change in the working conditions of the system that (possibly) influenced the impedance curve. Such a change could for example be a severe temperature change of parts of the system, e.g. of the PV-generator under intense solar irradiation.

In a next act S6, a signal related to an AC-current flowing in the power circuit is measured within the preferred frequency range. By comparing the signal amplitude with the adapted threshold it is then analyzed in a next act S7, whether the signal amplitude measured in act S6 indicates the presence of an electric arc in the DC-power circuit. If not, the method branches back to act S6.

In one embodiment, to achieve an insusceptible detection the measured amplitude of the signal is smoothed by averaging. This can for example be achieved by integration through analogue filtering within the filter and amplifier unit 16 or by numerical averaging in digital signal processing. Averaging particularly decreases the sensitivity for short-term disturbers (transients, peaks). In case of digital signal processing, a floating average, also called running average, of the sampled signal amplitudes can be performed.

A suitable integration constant (or length of the averaging time interval) in one embodiment is of the order of some milliseconds. It is furthermore possible to account for drifts in the signal amplitude that occur on a much larger time scale. In order to compensate for drifts, a further integration or averaging process can be performed with an integration time constant (or an averaging time interval) in the order of some seconds. The value derived from the long time integration or averaging process is then treated as an offset value and is subtracted from the short time average before the difference value is compared to the given threshold.

It is an additional or alternative option to analyze the time derivative of the measured amplitude signal, and compare this time derivative to a further pre-determined threshold. The described methods of smoothing and drift compensating the signal can be advantageously applied to the time derivative of the signal as well. In a particular embodiment, the signal amplitude and its time derivative are both inspected.

In case the threshold (and/or the further threshold) is/are exceeded (YES at S7), the method continues with a next act S8, in which the occurrence of an arc fault is signalled, for example by setting the arc signalling line 19 to an active level. The signalling line 19 could be connected to a visual and/or acoustical alarm indicator informing about the detected occurrence of an electric arc in the power circuit.

In a next optional act S10, additional means or circuits for interrupting the detected arc fault are activated. In the PV-system 1 according to FIG. 1 an input stage of the DC/AC-converter 5 could for example first shorten the input of the inverter 5 and thus the DC-power lines 3, 4, which would extinguish a parallel arc 7. Then the input stage could be set to a high input resistance, which would extinguish a serial arc 8.

In a next act S11, the system waits for a manual reset by an operator of the system. The arc fault is signalled as long as the system is not reset manually. Only in case of a manual reset, the method branches back to act S1 in order to start operation of the DC-circuit again and resume normal operation.

To correctly determine the frequency response of the DC-power circuit (acts S2 and S3) it has to be ensured that neither the incoupling circuit 11 nor the outcoupling circuit 13 show a deviation from a linear signal transmission. Particular care has to be taken if high DC-currents flow through the secondary side 112 of the incoupling circuit 11 or the primary side 131 of the outcoupling circuit 13. In case of high currents the incoupling- and/or outcoupling circuits 11, 13 could saturate and the measurement would be distorted. One option is to perform acts S2 and S3 in a mode of operation of the DC-power circuit in which no or only a low DC-current flows. If the measurement of the frequency response is to be performed while high DC-currents flow in the DC-power circuit, suitable non-saturating incoupling- and outcoupling circuits 11, 13 are to be used. In case of transformers as incoupling- or outcoupling circuits 11, 13, a coreless transformer can for example be used rather than a transformer with a saturating core.

It is finally noted that the foregoing description and the drawings are examples and not restrictive and that the disclosure is not limited to the disclosed embodiments. Other variations to the disclosed embodiments can be understood and effected by those skilled in the art from a study of the drawings, the disclosure, and the appended claims.

The invention claimed is:

1. A method of detecting an arc fault in a power circuit, the method comprising:
    a) injecting an AC-signal into the power circuit;
    b) measuring a response signal related to the injected AC-signal within the power circuit;
    c) determining a frequency response of the power circuit from the response signal;
    d) analyzing the frequency response and identifying a preferred frequency range; wherein the preferred frequency range is chosen to be located around a minimum of the impedance curve;
    e) measuring a signal related to AC-current flowing in the power circuit within the preferred frequency range; and
    f) signaling an occurrence of an arc fault in the power circuit depending on the measured signal.

2. The method of claim 1, wherein acts a) to d) are performed nonrecurring at a beginning of a predetermined working period of the power circuit, while the acts e) and f) are performed repeatedly during this working period.

3. The method of claim 1, wherein the injected AC-signal comprises signals at various frequencies.

4. The method of claim 3, wherein the injected AC-signal is a noise signal.

5. The method of claim 1, wherein a frequency of the injected AC-signal is varied.

6. The method of claim 1, wherein the preferred frequency range is chosen such that it does not comprise a distinct maximum of an impedance curve derived from the frequency response.

7. The method of claim 1, wherein the occurrence of an arc fault is signaled if a value related to an amplitude of the signal within the preferred frequency range exceeds a predetermined threshold.

8. The method of claim 1, wherein the occurrence of an arc fault is signaled if a value related to a time derivative of an amplitude of the signal within the preferred frequency range exceeds a further predetermined threshold.

9. The method of claim 8, wherein the occurrence of an arc fault is signaled only if the predetermined threshold and the further predetermined threshold are exceeded.

10. The method of claim 8, wherein the value related to the amplitude or its time derivative is a floating average of the amplitude of the signal or its time derivative, respectively.

11. The method of claim 8, wherein the value related to the amplitude or its time derivative is a combination of two floating averages of the amplitude or its time derivative with different integration windows.

12. The method of claim 8, wherein the predetermined threshold or the further predetermined threshold, or both, are determined depending on an impedance curve derived from the frequency response.

13. An arc fault detection system for a power circuit, comprising
an incoupling circuit configured to inject an AC-signal into the power circuit;
an outcoupling circuit configured to measure a response signal related to AC-current flowing in the power circuit in response to the injection by the incoupling circuit;
a control unit operably connected to the incoupling circuit and the outcoupling circuit;
wherein the control circuit is configured to determine a frequency response from the response signal, analyze the frequency response, and identify a preferred frequency range in response thereto;
wherein the preferred frequency range is chosen to be located around a minimum of the impedance curve; and
wherein the control unit is configured to evaluate a signal related to AC current flowing in the power circuit within the preferred frequency range and signal an occurrence of an arc fault in the power circuit based on the evaluated signal.

14. The arc fault detection system of claim 13, wherein the incoupling circuit comprises a signal generator configured to generate a white noise signal with a substantially continuous frequency spectrum or a single frequency signal that is varied or swept over a frequency range.

15. The arc fault detection system of claim 13, wherein the outcoupling circuit further comprises an oscillator circuit having a tunable frequency range that defines the preferred frequency range in which the signal is evaluated.

16. The arc fault detection system of claim 13, wherein the outcoupling circuit further comprises a tuneable band-pass filter.

17. The arc fault detection system of claim 13, wherein the control circuit further comprises:
an envelope detector configured to convert the evaluated signal into a DC signal representative of the evaluated signal; and
a threshold detector configured to compare the DC signal to a predetermined threshold value and signal an arc fault if the DC signal exceeds the predetermined threshold value.

18. The arc fault detection system of claim 17, wherein the evaluated signal comprises the DC signal averaged over an averaging time interval.

19. The arc fault detection system of claim 17, wherein the control circuit further comprises a circuit configured to measure a time derivative of an amplitude of the evaluated signal and compare the time derivative to a further predetermined threshold.

* * * * *